(12) United States Patent
Kovacs

(10) Patent No.: US 12,404,888 B2
(45) Date of Patent: Sep. 2, 2025

(54) CLAMP ASSEMBLY USING PINS

(71) Applicant: PMC Industries, Inc., Plainville, CT (US)

(72) Inventor: Tamas Kovacs, Burlington, CT (US)

(73) Assignee: PMC Industries, Inc., Plainville, CT (US)

( * ) Notice: Subject to any disclaimer, the term of this patent is extended or adjusted under 35 U.S.C. 154(b) by 189 days.

(21) Appl. No.: 18/149,786

(22) Filed: Jan. 4, 2023

(65) Prior Publication Data

US 2023/0151834 A1    May 18, 2023

Related U.S. Application Data

(63) Continuation-in-part of application No. 17/164,839, filed on Feb. 1, 2021, now Pat. No. 11,614,111, which
(Continued)

(30) Foreign Application Priority Data

Jul. 10, 2014  (WO) ................ PCT/US2014/046242

(51) Int. Cl.
*B25B 5/00*  (2006.01)
*B25B 5/10*  (2006.01)
(Continued)

(52) U.S. Cl.
CPC ............ *F16B 5/0064* (2013.01); *B25B 5/003* (2013.01); *B25B 5/101* (2013.01); *B25B 5/16* (2013.01);
(Continued)

(58) Field of Classification Search
CPC .......... F16M 13/022; F16M 5/00; B25B 1/20; B25B 5/00; B25B 5/16; B25B 5/125; B25B 5/082; F24S 25/615
See application file for complete search history.

(56) References Cited

U.S. PATENT DOCUMENTS 4,936,005 A    6/1990 Dziurowitz
5,375,956 A *  12/1994 Pennig ............... A61B 17/8605
                                                          411/397
(Continued)

FOREIGN PATENT DOCUMENTS

WO        2013055900 A3    6/2013

*Primary Examiner* — Lee D Wilson
(74) *Attorney, Agent, or Firm* — WASSERBAUER LAW, LLC; Damian G. Wasserbauer, Esq.; Nicholas E. Blanton, Esq.

(57) ABSTRACT

A versatile clamp assembly that may be used for securing a device generally to an edge of a structure such as a raised portion of a standing seam of a metal roof. The assembly comprises a mounting body with an open loop having a slot for receiving the raised portion formed by the mounting body attaching the clamp assembly thereto. The assembly is configured with one or more pins that may be configured to be received in one or more push-pin openings formed in the mounting body, whereby the push-pin openings extend from a fastener base portion to a second arm portion. The assembly includes a fastener adapted to be received in a fastener opening formed adjacent the push-pin openings. The fastener is configured to secure and hold the clamp assembly to the standing seam by forcing the pins against the raised portion of the surface disposed in the slot.

8 Claims, 7 Drawing Sheets

Related U.S. Application Data is a continuation of application No. 15/907,229, filed on Feb. 27, 2018, now Pat. No. 10,907,670, which is a continuation of application No. 14/443,567, filed as application No. PCT/US2014/046242 on Jul. 10, 2014, now Pat. No. 9,957,988.

(51) Int. Cl.

| | | |
|---|---|---|
| B25B 5/16 | (2006.01) | |
| F16B 2/06 | (2006.01) | |
| F16B 5/00 | (2006.01) | |
| F16B 43/02 | (2006.01) | |
| F16M 13/02 | (2006.01) | |
| F24S 25/615 | (2018.01) | |
| H05K 7/14 | (2006.01) | |

(52) U.S. Cl.
CPC ............ *F16B 2/065* (2013.01); *F16B 5/0072* (2013.01); *F16B 43/025* (2013.01); *F16M 13/02* (2013.01); *F16M 13/022* (2013.01); *F24S 25/615* (2018.05); *H05K 7/1417* (2013.01); *Y02B 10/20* (2013.01); *Y02E 10/47* (2013.01)

(56) References Cited

U.S. PATENT DOCUMENTS

| | | | | |
|---|---|---|---|---|
| 5,493,833 | A * | 2/1996 | Irimies | E04C 5/0645 |
| | | | | D8/382 |
| 5,584,626 | A * | 12/1996 | Assmundson | F16B 31/021 |
| | | | | 411/6 |
| 5,697,601 | A * | 12/1997 | Gurule | B23B 47/28 |
| | | | | 269/104 |
| 5,718,640 | A | 2/1998 | Maddock | |
| 6,688,047 | B1 | 2/2004 | McNichol | |
| 6,699,250 | B1 * | 3/2004 | Osterle | A61B 17/8625 |
| | | | | 606/311 |
| 6,908,271 | B2 * | 6/2005 | Breslin | F16B 39/023 |
| | | | | 411/57.1 |
| 7,386,922 | B1 | 6/2008 | Taylor et al. | |
| 8,272,172 | B2 * | 9/2012 | Li | F24S 25/615 |
| | | | | 52/24 |
| 8,505,864 | B1 | 8/2013 | Taylor et al. | |
| 8,898,961 | B1 | 12/2014 | Cline | |
| 9,957,988 | B2 | 5/2018 | Kovacs et al. | |
| 10,907,670 | B2 | 2/2021 | Kovacs et al. | |
| 11,345,414 | B1 * | 5/2022 | Eaton | B60J 1/006 |
| 11,352,793 | B2 * | 6/2022 | Haddock | E04D 13/00 |
| 11,739,529 | B2 * | 8/2023 | Haddock | E04D 13/10 |
| | | | | 248/230.5 |
| 12,000,510 | B2 * | 6/2024 | Pruitt | F16L 3/24 |
| 2004/0067122 | A1 * | 4/2004 | Post | F16B 5/02 |
| | | | | 411/383 |
| 2005/0082730 | A1 * | 4/2005 | Murray | B25B 5/068 |
| | | | | 269/166 |
| 2011/0272545 | A1 * | 11/2011 | Liu | F24F 13/32 |
| | | | | 248/222.14 |
| 2012/0137841 | A1 * | 6/2012 | Wesley, Jr. | F16B 33/002 |
| | | | | 411/411 |
| 2012/0180406 | A1 | 7/2012 | Kobayashi | |
| 2012/0299233 | A1 * | 11/2012 | Header | F24S 25/615 |
| | | | | 269/91 |
| 2013/0161462 | A1 * | 6/2013 | Haddock | F16B 2/12 |
| | | | | 248/237 |
| 2013/0168525 | A1 | 7/2013 | Haddock | |
| 2016/0177984 | A1 | 6/2016 | Kovacs et al. | |
| 2017/0130884 | A1 | 5/2017 | Hartman | |
| 2020/0191180 | A1 * | 6/2020 | Haddock | F16B 2/10 |
| 2021/0180627 | A1 | 6/2021 | Kovacs et al. | |
| 2022/0298795 | A1 * | 9/2022 | Haddock | E04D 13/10 |
| 2023/0151834 | A1 * | 5/2023 | Kovacs | F16B 5/0072 |
| | | | | 361/825 |

\* cited by examiner

CLAMP ASSEMBLY USING PINS

CROSS-REFERENCE TO RELATED APPLICATIONS

This application is a continuation-in-part of, and claims the benefit of, U.S. patent application Ser. No. 17/164,839, filed on Feb. 1, 2021, which is a continuation of U.S. patent application Ser. No. 15/907,229 filed Feb. 27, 2018 now U.S. Pat. No. 10,907,670, which is a continuation of U.S. patent application Ser. No. 14/443,567 filed May 18, 2015 now U.S. Pat. No. 9,957,988, which is a national stage entry of PCT/US2014/046242 filed Jul. 10, 2014, which claims priority from U.S. Provisional Application No. 61/844,763 filed on Jul. 10, 2013, and the entire disclosure is hereby incorporated by reference herein.

TECHNICAL FIELD

The present invention is in the field of clamps and/or mounting assemblies that may be used for securing a device generally to an edge of a structure such as a raised portion of a standing seam of a metal roof, with the clamp configuration providing an improved hold that resists loosening from environmental conditions, including high winds, seismic vibration, and snow loads.

BACKGROUND

Conventional clamps and/or mounting assemblies are useful in consumer and/or industrial applications, for example, a metal roof uses clamp(s) to attach panels, solar panels, snow rails, wind clamps, signs, HVAC equipment, conduit and the like to an edge such as a standing seam formed by overlapping tiles or panels in a known way. The panels or tiles can be formed from metals and/or metal alloys such as for example, copper, aluminum, zinc coated steel, stainless steel, or other composite blend of such metals. Elongated panels are arranged longitudinally across a roof—from ridge line to overhang—overlapped and joined to form an edge that is termed a standing seam.

Moreover, conventional systems are constantly affected by thermal movement and vibration actions Thermal movement of the attachment system occurs as the metal of a roof is heated and cooled by the sun, and under snow loads. For example, threaded fasteners in clamps can loosen by the expanding and contracting to the point that the clamp can slide along the standing seam. Another condition that loosens clamps is vibration, for example, fasteners can torque, back-out, or otherwise loosen a clamp secured to the standing roof from high winds and seismic vibration, e.g. traffic, normal earth vibration, earthquakes and the like. In such applications a variety of systems and clamps are designed to withstand thermal and vibration activity to maintain a secure hold of devices and things attached to the edge, e.g. solar panels, satellite dishes, antennae, and other things e.g. footholds, guides, snow breaks, structures or general supports to the metal roof standing seam. As a result, there is a need in the art for improvements in holding clamps on a standing seam that overcomes the problem of thermal movement and that overcomes the problems of loosening from vibration and other factors.

Still other problems involve matching the standing seam to a particular clamp, which may be limited by the clamp's geometry and/or structure. Because securely locking to a standing seam depends upon the profile of the seam, i.e., the cross-sectional profile defining how the interlocking-portions couple to one another, conventional clamp designs commonly need to be tailored for, and selected according to, a specific profile. As a result, there is a need in the art for an improved, non-penetrating, and versatile clamp that accepts an edge with unique geometry structure so as not to limit the use and/or applications of the clamp.

SUMMARY

The present invention provides a versatile clamp assembly, capable of coupling to and securing a load to an edge of a structure such as the standing seam of a metal roof panel. The clamp is adapted to couple to a wide variety of seam profile geometries thereby reducing the amount of customization necessary in the fabrication, production, and/or assembly thereof. The clamp assembly is configured to substantially eliminate damage to the clamped edge of the structure, to provide an improved hold on the edge that does not diminish under the influence of human and environmental forces over time. In one aspect, the clamp assembly according to the present invention achieves this hold via pins configured to be inserted in smooth, non-threaded openings that provide translatable, rather than rotatable, coupling to the seam, thereby eliminating damage to the surface that occurs in conventional design. Therefore, the clamp assembly eliminates or substantially eliminates the aforementioned problems associated with conventional designs, including leakage, limiting the life of the roof from degradation, oxidation, taking away from the appearance, and voiding a manufacturer's warranty.

A further object of the present invention is to provide a versatile clamp assembly that may be used for securing a device generally to an edge of a structure such as a raised portion of a standing seam of a metal roof. The clamp assembly comprises a mounting body with an open loop having a slot for receiving the raised portion formed the mounting body attaching the clamp assembly thereto. The clamp body has a slot and/or side portions adapted to accept wide-profile seams, including but not limited to bulb-style and T-panel seam profiles.

A further object of the present invention is to provide a clamp assembly comprising pins having an improved length-of-travel, which may be adapted to accept wide-profile seams, including but not limited to bulb-style and T-panel seam profiles.

A further object of the present invention is to provide a clamp assembly comprising pins configured to travel, i.e., translate, and couple to, the standing seam at a substantially non-orthogonal angle, i.e., non-normal angle, with respect to the surface of contact of the seam. This arrangement provides certain advantages, including providing an improved clearance of the slot, and/or an increase in distance of the fastener head with respect to the roof surface, which may aid in coupling tools thereto, e.g., an electric screw driver.

In a further object of the present invention, the design provides improved manufacturability and reduced cost.

Other desirable features and characteristics will become apparent from the subsequent detailed description, the drawings, the abstract, and the claims, when considered in view of this summary.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, which are incorporated in and constitute a part of this specification, show certain aspects of the subject matter disclosed herein and, together with the description, help explain some of the principles associated with the disclosed implementations, wherein.

DETAILED DESCRIPTION

Figure 1:
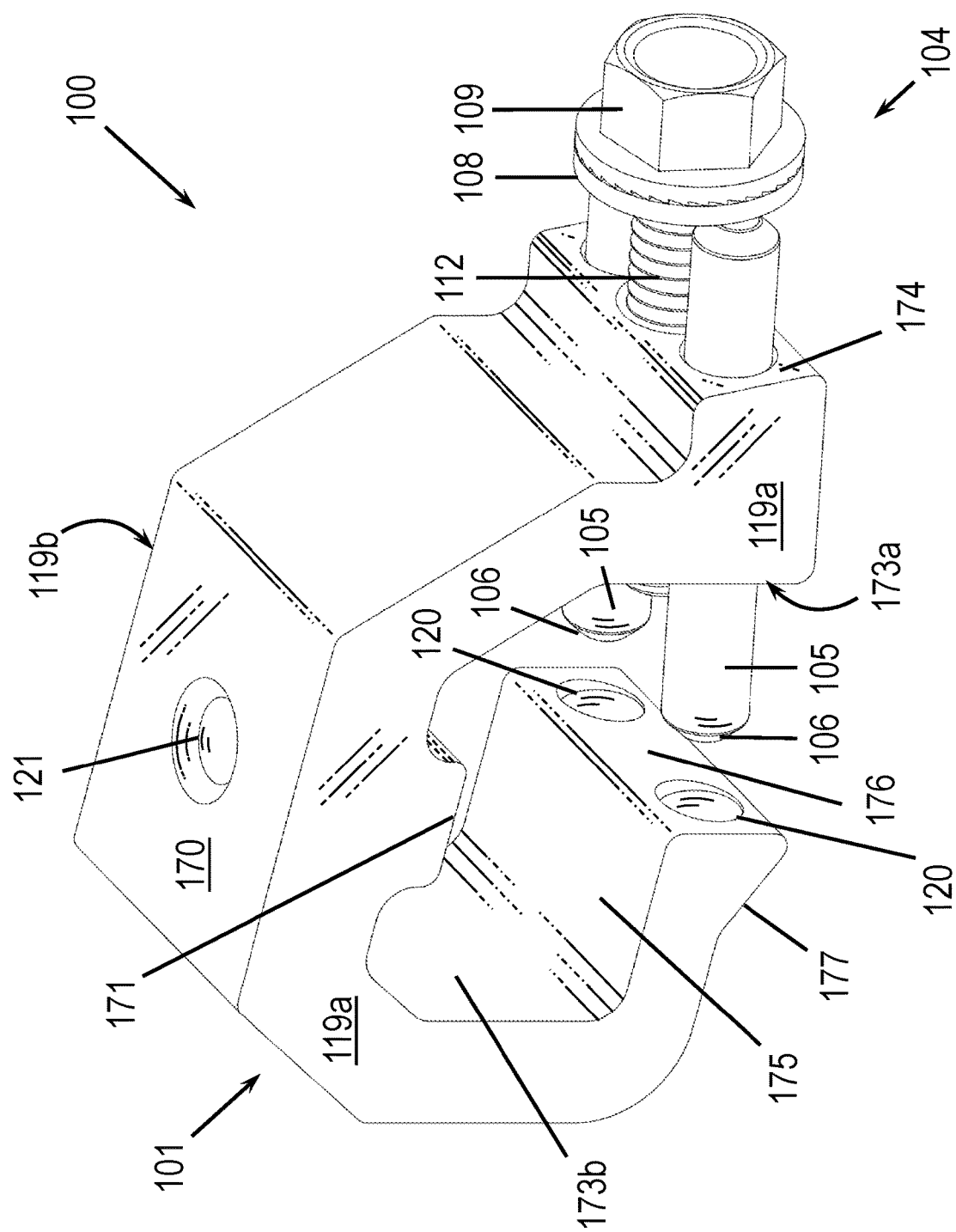
FIG. 1 illustrates a front, top, left-side perspective view of a clamp assembly for coupling a device to a standing seam of a metal roof panel, in accordance with an embodiment of the present invention.
Figure 2:
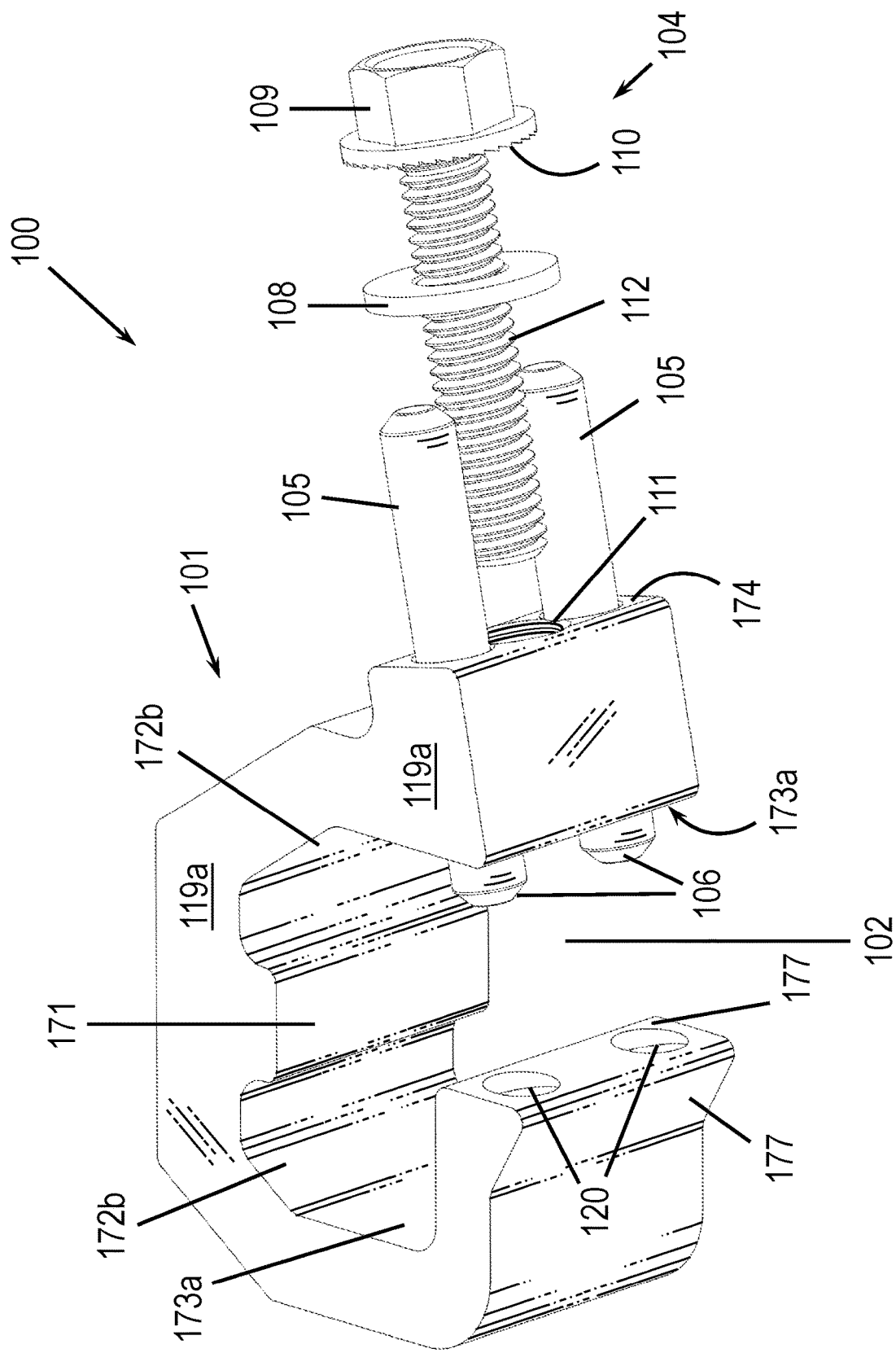
FIG. 2 illustrates a front, bottom, left-side, partially-exploded, perspective view of a clamp assembly for coupling a device to a standing seam of a metal roof panel, in accordance with an embodiment of the present invention.
Figure 3:
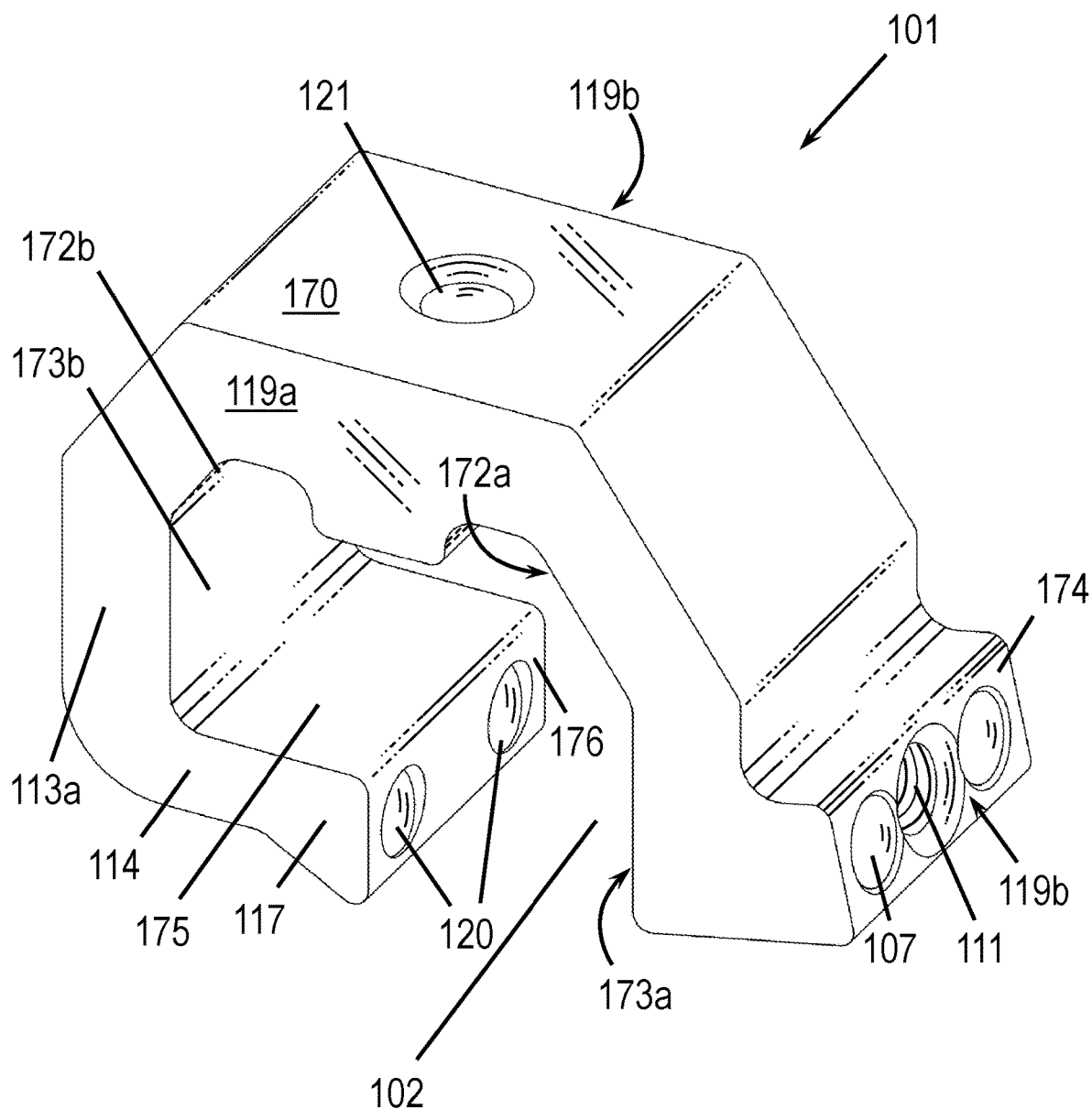
FIG. 3 illustrates a front, top, left-side perspective view of a clamp body for coupling a device to a standing seam of a metal roof panel, in accordance with an embodiment of the present invention.
Figure 4:
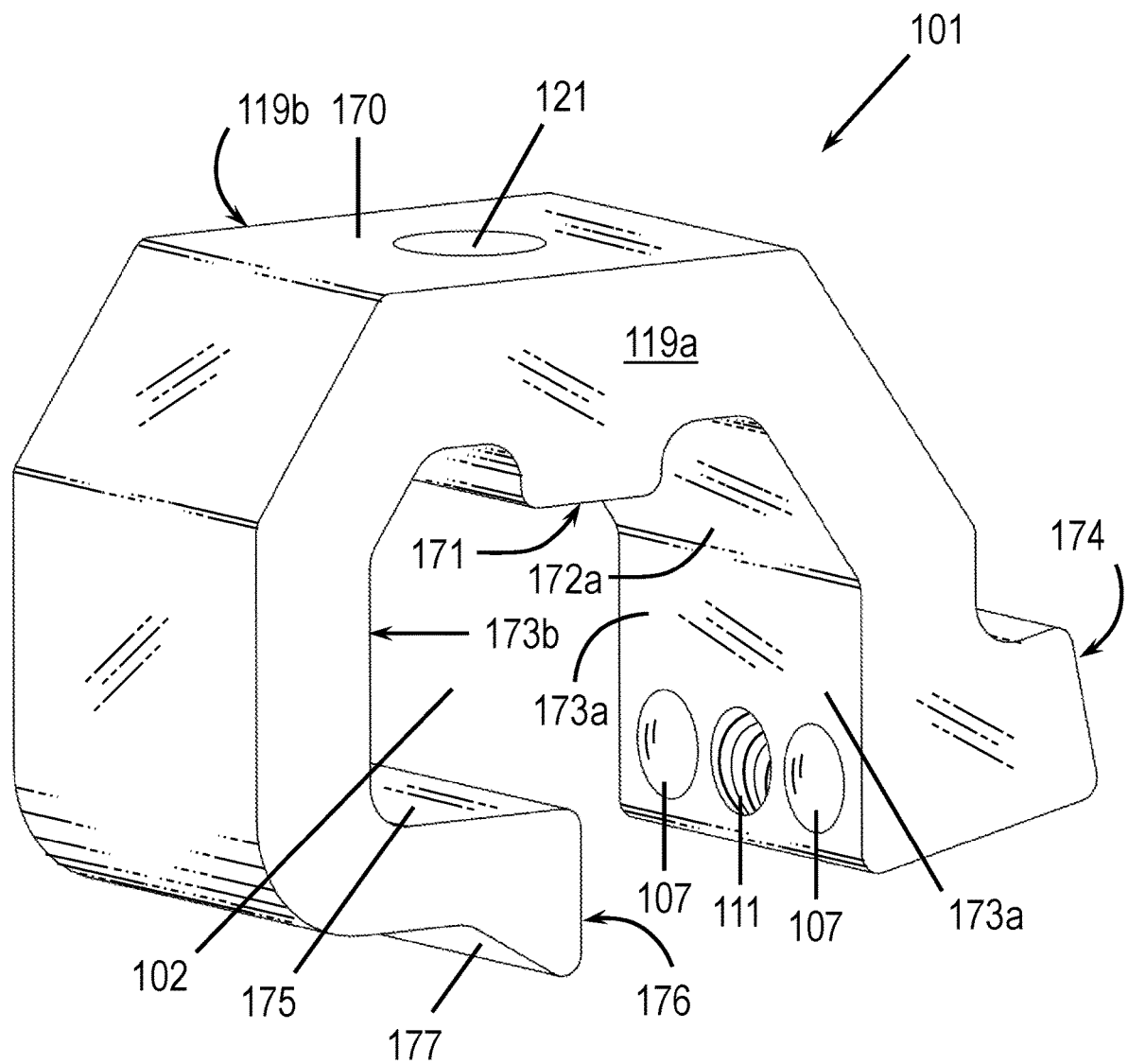
FIG. 4 illustrates a rear, top, left-side perspective view of a clamp body for coupling a device to a standing seam of a metal roof panel, in accordance with an embodiment of the present invention.

Non-limiting embodiments of the present invention will be described below with reference to the accompanying drawings, wherein like reference numerals represent like elements throughout. While the invention has been described in detail with respect to the preferred embodiments thereof, it will be appreciated that upon reading and understanding of the foregoing, certain variations to the preferred embodiments will become apparent, which variations are nonetheless within the spirit and scope of the invention.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", "operably coupled" as used herein, is defined as connected, secured, fixedly attached, or rigidly attached, although not necessarily directly, and not necessarily mechanically and that can be de-coupled.

Reference throughout this document to "some embodiments", "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The drawings featured in the figures are provided for the purposes of illustrating some embodiments of the present invention and are not to be considered as a limitation thereto. Term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

Referring to FIGS. 1-4, and 5A-7B, a versatile clamp assembly 100 generally useful for securing one or more devices to a structure comprises a mounting body 101 with a slot 102 adapted to receive an edge of the structure such as a variety of standing seam profiles of a metal roof so as to be secured thereto by a fastener assembly 104. As demonstrated in the embodiment shown in FIG. 5A and the alternative embodiment of FIG. 5B, mounting body 101 may be formed from a body base 160 of a predetermined shape that may be formed generally in an open loop shape, or other shape having a generally circular form, e.g., a G-shape, thereby forming a slot for receiving the raised portion formed the mounting body attaching the clamp assembly thereto. Body base 160 may take any suitable shape in terms of number of sides and individual dimension of each segment thereof. For example, body base 160 may include a device base segment 161 including a first arm base segment 163a disposed at one end, and a second arm base segment 163b disposed at the other end thereof. A fastener base segment 164 may extend outwardly from the first arm base segment 163a at an angle θ, and an abutment base segment may extend inwardly from the second arm base segment 163b. Angle θ may be any suitable acute or obtuse angle; however as illustrated herein, θ is about 80 degrees, and is adapted for positioning a fastener assembly 104 to allow for convenient access of a tool and/or to provide for a larger internal clearance, such as to provide a larger passage 180, which will be described further below. In a similarly manner, abutment segment may be disposed at an acute or obtuse angle with respect to a first angled base segment 162a may couple the device base segment 161 to the first arm base segment 163a. Similarly, a second angled base segment 162b may couple the device base segment 161 to the second arm base segment 163b.

Referring to FIGS. 1-4 and 5A-5B, body base 160 forms the predetermined shape that defines the mounting body 101, which is adapted to receive or otherwise couple to standing seams of different profiles, as well as to other things, thereby making a versatile clamp assembly 100. Mounting body 101 may be formed having a variety of thicknesses corresponding to the various segments of body base 160, or mounting body may be formed having a substantially uniform thickness therealong. For example, appropriate thickness(es) may be selected to reduce cost and ensure adequate strength and holding capability of the mounting body 101. Extending outwardly from each of these segments may be the actual surfaces of the mounting body 101, and they are described herein in kind. In this way, an upper portion 170 and an inner portion 171 may be offset from the device base segment 161, wherein the upper portion 170 may be configured to couple to a device, and the inner portion 171 may be configured to couple to a portion of the edge, that is in this embodiment a standing seam 103. First and second arm portions 173a and 173b may form the inner surfaces offset inwardly from first and second arm base segments 163a and 163b, respectively. First and second angled portions 172a and 172b may be formed between and couple each of the inner portion 171 on one side and first arm portion 173a, and the inner portion 171 on the other side and second arm portion 173b. The fastener base segment 164 may include a fastener base portion 174, wherein one or more push-pin openings 107 and a fastener opening 111 may be formed and extend through to the first arm portion 173a. Then, abutment base segment 165 may comprise a leg portion 175, an abutment portion 176, and a sloped surface 177, which is sloped in the direction of force to direct engagement of pins 105. Formed on and/or within the abutment portion 176 may be one or more pockets 120, such as a dimple shape, corresponding to each of the one or more pins 105 extending through said one or more push-pin openings. The one or more pockets 120 are configured to cooperate with the one or more pins 105 for increasing the holding force of the clamp assembly 100, whereby in operation tightening the fastener 109 of the fastener assembly 104 urges the one or more pins 105 against the standing seam 103 causing indentation or recess in the standing seam 103.

The clamp assembly 100 includes a fastener assembly 104 comprising a plurality of pins 105 that can be urged against the standing seam 103 in a non-rotating manner by tightening the fastening element 109 which transmits force to the ends 106 of pins 105 by pressing on the washer 108. The pins advantageously hold the mounting body 101 to the standing seam 103 with an evenly distributed holding force. The pins 105 align with pockets 120 on the abutment portion 176 allowing for slight deformation of the standing seam 103 into the pockets 120. The pin 105 and pocket 120 arrangement thereby improves securing and maintaining the purchase of the clamp assembly 100 to the standing seam 103 under adverse thermal, vibration, seismic, wind and other environmental conditions without deforming or twisting the raised seam 103 or roof. The pins 105 have ends 106 that may be flat or shaped, such as tapered ends 106 as shown herein. Shaped ends may have, for example, rounded, domed or tapered profiles. Smooth pin ends accomplish an object of the present invention which is to maintain the integrity of the surface paint, powder coat, Teflon, or other protective coating thereby avoiding cosmetic and/or structural imperfections due to the installation process and/or environmental stresses. The use of pins 105 in the clamp assembly 104 also eliminates manufacturing steps and cost such as, for example, the threading of holes of two or more set screws.

In operation, the pins 105 are urged against a standing seam 103 to a closed position by a washer 108 and a fastening element 109 with a locking portion 110. The washer 108 may be a flat washer or crush washer of suitable material, such as, for example, 300 Series Stainless Steel, and dimensioned 1" inch outer diameter and ⅜ inch inner diameter with a thickness of approximately 0.005"-0.075" inches. In an alternative embodiment, the fastening element 109 can be formed with an integral washer 108, or yet alternatively an integral washer 108 and locking portion 110. In operation the washer 108 may crush or deform under the torque and tightening of the fastening element 109. The washer 108 can deform on both surfaces: deforming or scoring the washer 108 by the operation of rotating against the ends of the pins 106 thereby forming a unique groove or channel; also simultaneously deforming on the other surface adjacent the locking portion 110 of the fastening element 109. In this manner, the present invention overcomes disadvantages of prior art systems where re-torquing and retightening of set screw fasteners is recommended and/or required.

The fastener 108 can be a flange head cap screw of suitable material, such as, for example, 300 Series Stainless Steel. The fastening element 109 has a locking portion 110 integrated on a surface adjacent the washer 108 or a surface that otherwise engages with the washer 108. In operation, torquing or tightening the fastening element 109 pushes on the washer 108 and on the ends 106 of the pins 105, thereby deforming the washer 108 as the locking portion 110 and pins 105 dig into the surface of the washer 108. The fastening element 109 operates to move the fastener assembly 104 between open and closed positions. The closed position in this context refers to when the pins 105 are securely engaged with the standing seam 103.

The various embodiments contemplated herein of the clamp assembly 100, according to the present invention, may or may not employ either or both of the first and second angled base segments 162a, 162b, i.e., the corresponding first and second angled portions 172a and 172b. Similarly, the inner portion 171 may be characterized by a single continuous flat or contoured surface extending between first and second arm portions 173a and 173b, such as in the embodiment shown in FIGS. 5B, 6B, and 7B. Alternatively, inner portion 171 may be characterized by a plurality of flat and/or contoured surfaces extending between first and second arm portions 173a and 173b, such as in the embodiment shown in FIGS. 1-4, 5A, 6A, and 7A. Additionally, sloped portion 177 may or may not be employed. When employed, sloped portion 177 may be disposed inwardly, such as in the embodiment shown in FIGS. 5B, 6B, and 7B, or outwardly, as in the embodiment shown in FIGS. 1-4, 5A, 6A, and 7A. Furthermore, upper surface 170 may or may not comprise an attachment opening 121, adapted for coupling a device to the structure via the clamp assembly 100 and standing seam 103. Upper surface 170 may be adequately shaped, either substantially flat or contoured, to support a device under the force of gravity.

Figure 5A:
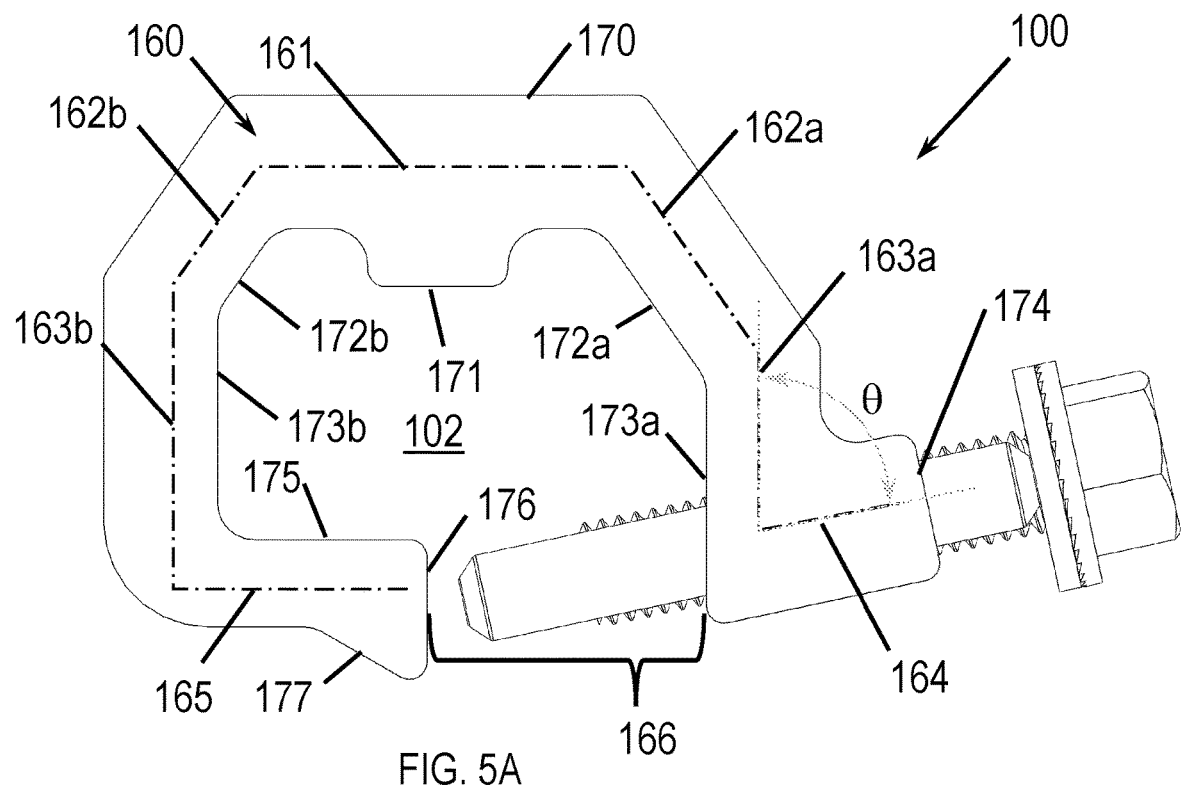
FIG. 5A illustrates a left-side view of a clamp body including a body base portion, in accordance with an embodiment of the present invention.
Figure 5B:
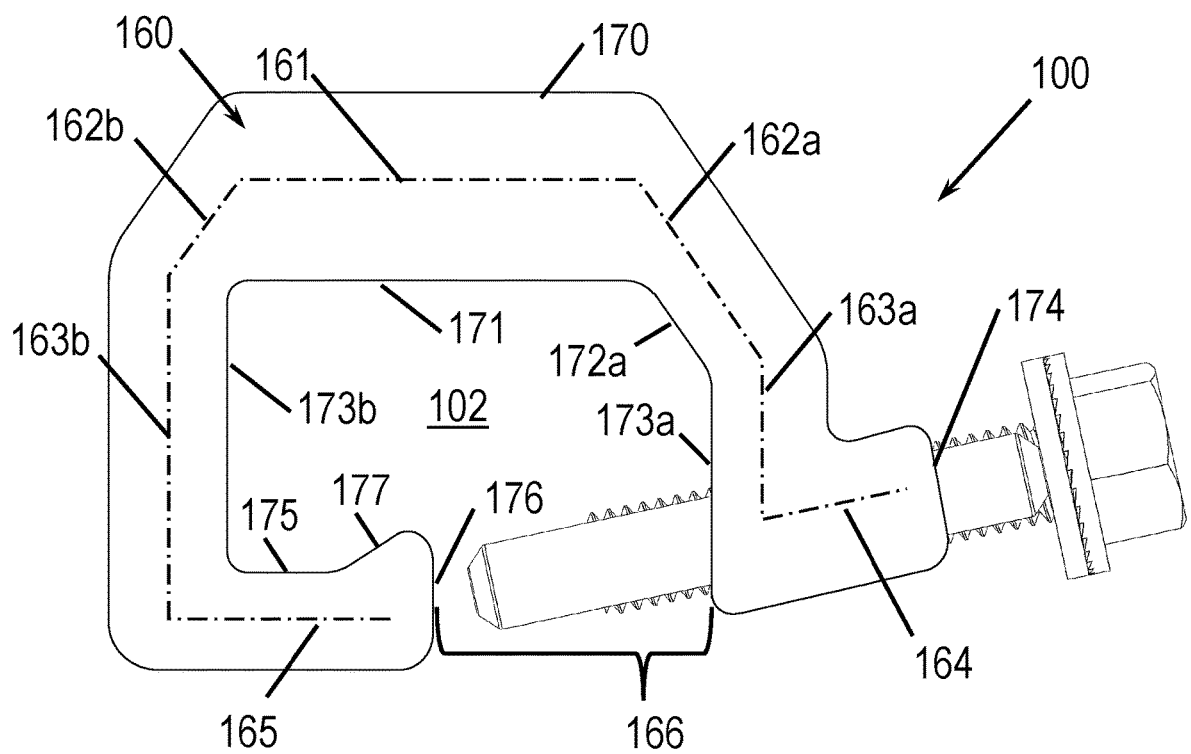
FIG. 5B illustrates a left-side view of a clamp body including a body base portion, in accordance with another embodiment of the present invention.

As previously described, clamp assembly 100 comprises, according to the present invention, the various segments of body base 160 corresponding to portions including at least upper and inner portions 170, 171, first and second arm portions 173a, 173b, fastener base portion 174, leg portion 175 and abutment portion 176 that create a slot 102, which is generally adapted for clamping to standing seams 103 having a variety of profiles and provide secure coupling of one or more devices thereto. As represented in FIGS. 5A and 5B, abutment portion 176 and second arm portion 173b define a body entry 166, which defines the opening to slot 102, and is sized to accommodate shapes and seam profiles common to, e.g., the architectural industry. Furthermore, in an open position, approximately as represented in partially-exploded view of FIG. 2, tapered ends 106 of pins 105 may be fully retracted within pin openings 107, and similarly the threaded 112 portion of fastening element 109 within fastener opening 111 such that the full dimension of body opening 166 may be utilized to accept a head of a standing seam within slot 102. Once the clamp assembly is in position with respect to the intended location on the standing seam 103, fastener assembly 104 may be advanced via tightening of fastener element 109, with linear translation of the pins 105 through pin openings 107 wherein the force of the fastener element 109 is transmitted to the pins 105 through washer 108. Fastener element 109 may include locking portions 110 to inhibit retraction of the fastener once assembled and/or secured about the seam 103.

Figure 6A:
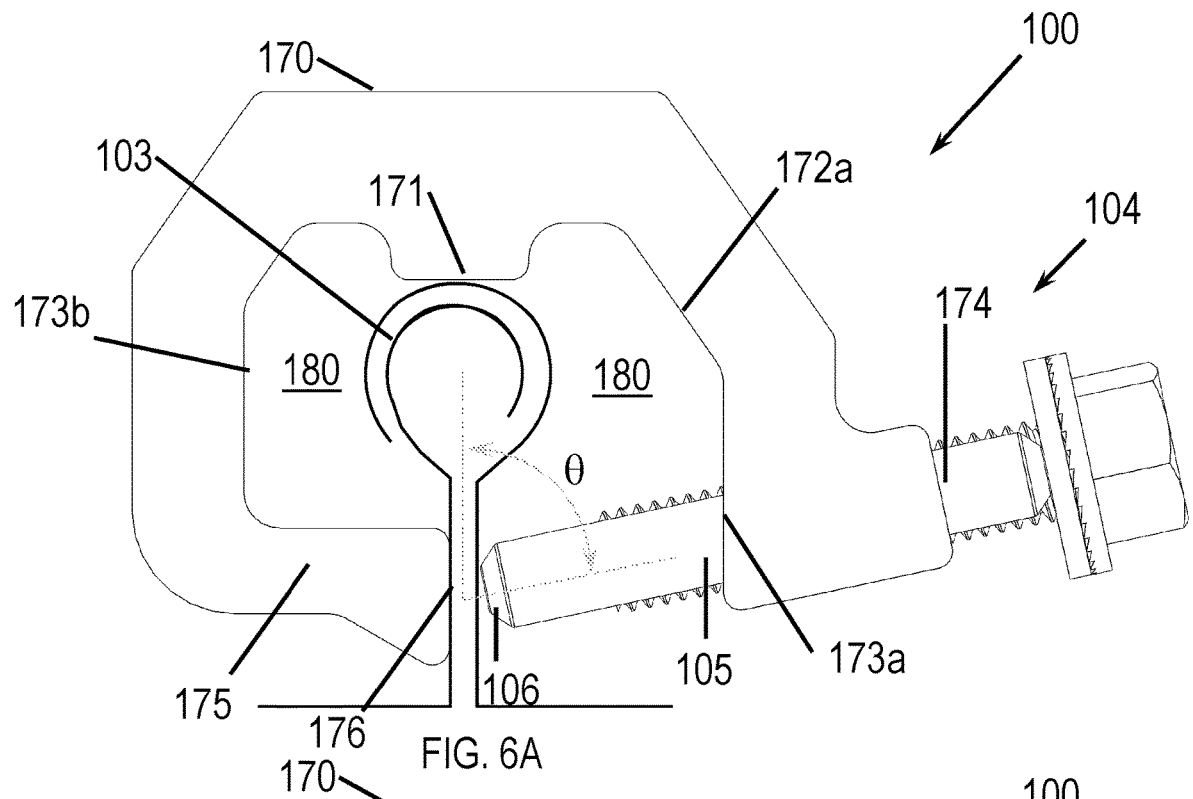
FIG. 6A illustrates a clamp assembly coupled to a standing seam having a bulb-style profile, wherein the standing seam is shown without any substantial deformation for clarity, in accordance with an embodiment of the present invention.
Figure 6B:
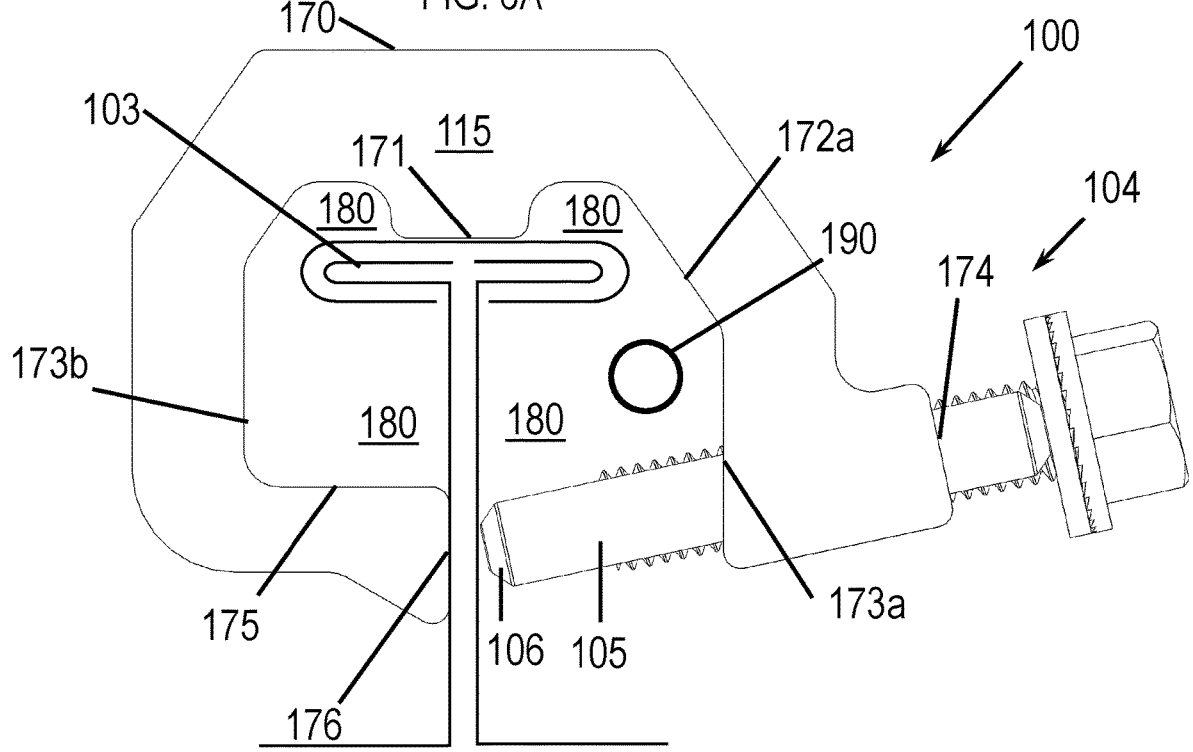
FIG. 6B illustrates a clamp assembly coupled to a standing seam having a T-panel profile, wherein the standing seam is shown without any substantial deformation for clarity, in accordance with an embodiment of the present invention.
Figure 7A:
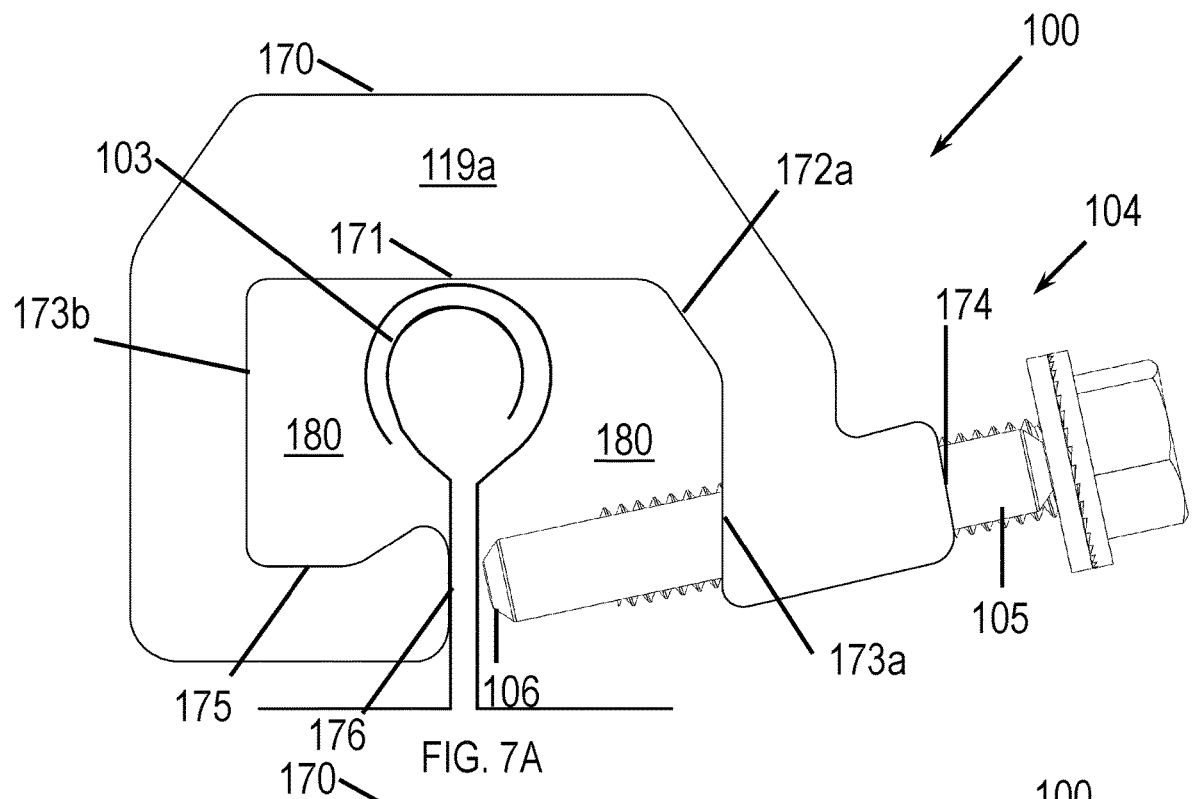
FIG. 7A illustrates a clamp assembly coupled to a standing seam having a bulb-style profile, wherein the standing seam is shown without any substantial deformation for clarity, in accordance with an alternative embodiment of the present invention.
Figure 7B:
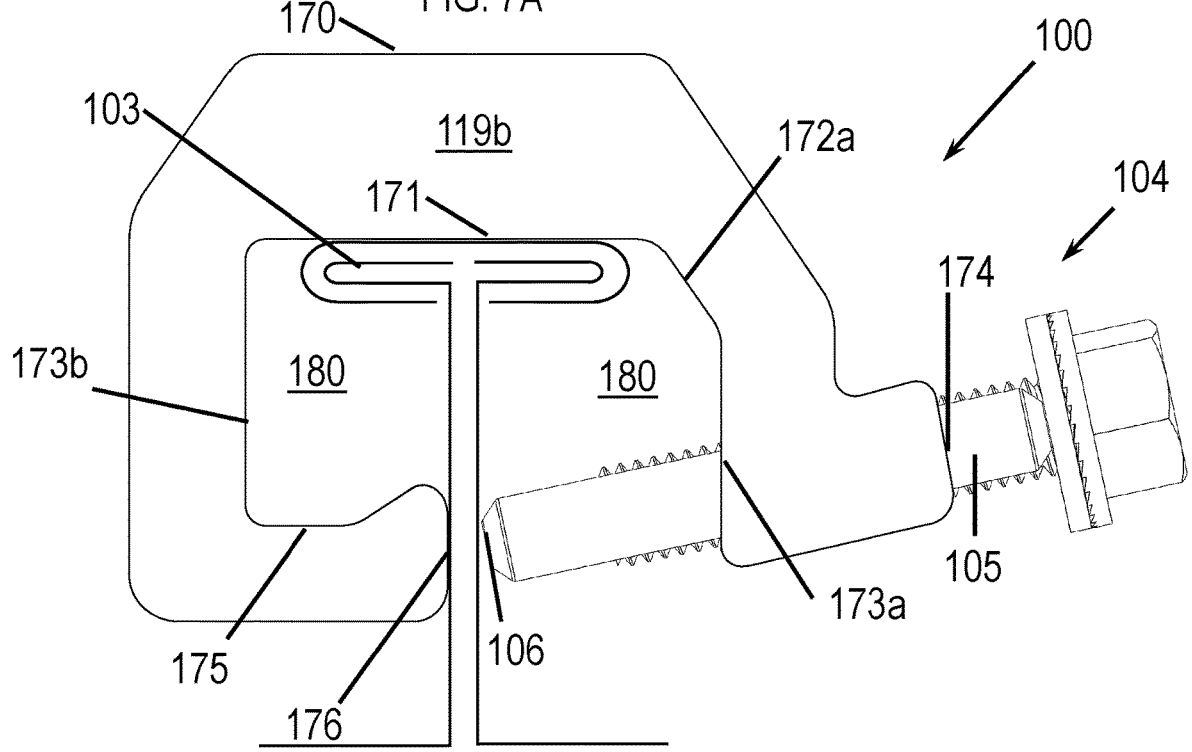
FIG. 7B illustrates a clamp assembly coupled to a standing seam having a T-panel profile, wherein the standing seam is shown without any substantial deformation for clarity, in accordance with an alternative embodiment of the present invention.

In the embodiment represented in FIGS. 6A and 6B according to the present invention, clamp assembly 100 is shown in an approximate closed position about seam 103. FIG. 6A represents a standing seam 103 having a bulb-style profile, and FIG. 6B represents a standing seam 103 having a T-panel profile. In an alternative embodiment represented in FIGS. 7A and 7B according to the present invention, clamp assembly 100 is shown in an approximate closed position about seam 103. FIG. 7A represents a standing seam 103 having a bulb-style profile, and FIG. 7B represents a standing seam 103 having a T-panel profile. Regardless of the embodiment, deformation of the panel may or may not be perceptible to the naked eye, especially when the clamp is engaged thereon, and therefore the figures herein illustrating the closed position are for representative purposes. Body entry 166 can be seen to be sized accordingly to allow entry of either the blub-style or the T-panel profiles. In one embodiment, the body entry 166 is dimensioned to approximately 1" (inch), but may be larger or smaller sized as appropriate for the intended application and/or field of use. The one or more pins 105 may be about 2.1" (inches) in length and about $5/16$" (inch) in diameter, and may also be sized as appropriate. Clamp assembly 100 according to the present invention may be adapted for coupling a device to any profile standing seam, including, but not limited to: trapezoidal panel, butler panel, double lock panel, snap lock panel, snap lock short panel, single lock panel, butler panel, T-panel, bulb-style panel, and/or zip rib panel. The aforementioned angle θ may be selected to accommodate a particular profile, for example an angle θ of about 80 degrees, which may be adapted for larger profiles, such as for the bulb-style or T-panel profiles.

The selection of at least upper portion 170, inner portion 171, first and second angled portions 172a, 172b, first and second arm portions 173a and 173b, fastener base portion 174, leg portion 175, abutment portion 176, and sloped portion 177 may be selected and/or dimensioned to provide the structural support necessary to securely couple a device to a standing seam 103, as well as to reduce cost in parts of clamp assembly 100. For example, as previously mentioned, body entry 166 may be sized to accommodate larger-dimensioned heads and/or ends of standing seams 103. Also, the linear distance between first and second arm portions 173a and 173b may be selected to accommodate larger- or smaller-shaped profiles. Additionally, anchor portions, e.g., points, may be formed along one or more surfaces of clamp assembly 100, such as inner portion 171, abutment portion 176, and tapered end 106 of one or more pins 105, as shown representatively in FIGS. 5A-7B.

In another advantage according to the present invention, clamp assembly 100 when in an assembled, i.e., closed, position about standing seam 103 provides one or more passage portions 180, determined according to the free space adjacent the clamp assembly 100 and seam 103, for the holding of items and things, such as cable 190, shown representatively as a cross-section in FIG. 6B. According to the embodiment shown in FIGS. 6A and 7A for example, two passage portions 180 are formed proximate either lateral side of the standing seam 103. As another example in FIG. 6A, four passage portions 180 are formed above and below the T, and as a final example shown in 7B, two passage portions 180 are formed.

Devices for coupling via clamp assembly 100 to one or more standing seams 103 include, but are not limited to panels, solar panels, snow rails, wind clamps, signs, HVAC equipment, conduit, and the like to a metal roof. The attachment opening 121 may be threaded so as to accept a threaded fastener or smooth so as to accept a self-tapping fastening element (e.g. self-tapping bolt, screw, etc.) which then serves to attach the device to the mounting body 101. The mounting body 101 may be formed from metal or metal alloys such as stainless steel, aluminum, aluminum alloys such as 6061-T6, or other materials with suitable strength and resistance to environmental conditions. The body base 160 and corresponding elements of the mounting body 101 may be manufactured from, for example, extruded stock. The longitudinal dimension of the mounting body 101, e.g., out-of-plane in FIG. 5A, may be formed by cutting an extruded bar, having the cross-sectional shape described herein, to a desired length for a particular application. Each of the various openings, such as the push-pin openings 107, the fastener opening 111, and the attachment opening 121, can be formed in the mounting body 101 by computer numeric controlled (CNC) machining, milling or other suitable manufacturing process. The mounting body 101 and/or the one or more pins 105 may be deburred, i.e., removal of sharp edges, such as by using a vibratory tumbler to remove the burrs and sharp edges that can damage the surface or coating of a standing seam 103.

While certain configurations of structures have been illustrated for the purposes of presenting the basic structures of the present invention, one of ordinary skill in the art will appreciate that other variations are possible which would still fall within the scope of the appended claims. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clamp assembly for securing a device to an edge of a structure, said clamp assembly comprising:
   a mounting body of a generally longitudinal cross-section including an upper portion adapted to couple to said device, an inner portion, first and second arm portions, a fastener base portion extending outwardly from said first arm portion, a fastener opening and one or more pin openings each extending through said mounting body from said fastener base portion to said first arm portion, and an abutment portion extending inwardly from said second arm portion at an end of a leg portion,
wherein at least said inner portion, said first and second arm portions, said leg portion, and said abutment portion form a slot within said mounting body,
one or more smooth pins, each of said one or more smooth pins having a substantially elongated cylindrical shape, each of said one or more smooth pins being received in said one or more pin openings; and
a fastening element, said fastening element adapted to operably couple to said fastener opening, said fastener element configured to secure said clamp assembly and configured to distribute a force of said fastening element to translate said one or more smooth pins against the edge of the structure disposed in said slot.

2. The clamp assembly of claim 1, wherein said mounting body further comprises a fastener base segment disposed at an acute angle with respect to said first arm portion defining a vertical direction.

3. The clamp assembly of claim 2, wherein said angle is about 80 degrees.

4. The clamp assembly of claim 1, further comprising a body entry defined by the space between fastener base and stop base.

5. The clamp assembly of claim 4, wherein said body entry is about 1 inch.

6. The clamp assembly of claim 1, wherein said abutment portion further comprises one or more pockets corresponding to said one or more pins.

7. The clamp assembly of claim 1, wherein in a closed position corresponding to the clamp assembly being securely coupled to the edge, said clamp assembly further comprises at least one passage portion, for the holding of items.

8. The clamp assembly of claim 1, the edge is a raised portion and/or standing seam of a metal roof structure having a profile selected from the group consisting of: trapezoidal panel, butler panel, double lock panel, snap lock panel, snap lock short panel, single lock panel, butler panel, T-panel, bulb-style panel, zip rib, mechanical lock, batten panel ("Tee"), nail flange, single fold, double fold, bulb, trapezoidal, and/or applied cap.

* * * * *